US008995195B2

United States Patent
Duzly et al.

(10) Patent No.: US 8,995,195 B2
(45) Date of Patent: Mar. 31, 2015

(54) FAST-READING NAND FLASH MEMORY

(71) Applicant: SanDisk Technologies Inc., Plano, TX (US)

(72) Inventors: Yacov Duzly, Raanana (IL); Alon Marcu, Tel-Mond (IL); Yuval Kenan, Kibbutz Gezer (IL); Yan Li, Milpitas, CA (US); Man Lung Mui, Fremont, CA (US); Seungpil Lee, San Ramon, CA (US)

(73) Assignee: SanDisk Technologies Inc., Plano, TX (US)

( * ) Notice: Subject to any disclaimer, the term of this patent is extended or adjusted under 35 U.S.C. 154(b) by 159 days.

(21) Appl. No.: 13/765,349

(22) Filed: Feb. 12, 2013

(65) Prior Publication Data

US 2014/0226402 A1    Aug. 14, 2014

(51) Int. Cl.
G11C 11/34 (2006.01)
G11C 16/10 (2006.01)
G11C 11/56 (2006.01)
G11C 16/26 (2006.01)

(52) U.S. Cl.
CPC ............ G11C 16/10 (2013.01); G11C 11/5642 (2013.01); G11C 16/26 (2013.01)
USPC ............ 365/185.18; 365/185.23; 365/189.15; 365/204

(58) Field of Classification Search
CPC ..... G11C 16/10; G11C 16/26; G11C 11/5642
USPC .................... 365/185.18, 185.23, 189.15, 204
See application file for complete search history.

(56) References Cited

U.S. PATENT DOCUMENTS

| | | | |
|---|---|---|---|
| 5,070,032 A | 12/1991 | Yuan et al. | |
| 5,095,344 A | 3/1992 | Harari | |
| 5,313,421 A | 5/1994 | Guterman et al. | |
| 5,315,541 A | 5/1994 | Harari et al. | |
| 5,343,063 A | 8/1994 | Yuan et al. | |
| 5,570,315 A | 10/1996 | Tanaka et al. | |
| 5,595,924 A | 1/1997 | Yuan et al. | |
| 5,661,053 A | 8/1997 | Yuan | |
| 5,768,192 A | 6/1998 | Eitan | |
| 5,892,713 A * | 4/1999 | Jyouno et al. | 365/185.11 |
| 5,903,495 A | 5/1999 | Takeuchi et al. | |
| 5,969,990 A * | 10/1999 | Arase | 365/185.25 |
| 6,011,725 A | 1/2000 | Eitan | |
| 6,046,935 A | 4/2000 | Takeuchi et al. | |
| 6,075,723 A * | 6/2000 | Naiki et al. | 365/185.03 |
| 6,222,762 B1 | 4/2001 | Guterman et al. | |
| 7,257,028 B2 * | 8/2007 | Lee et al. | 365/185.18 |
| 7,336,532 B2 * | 2/2008 | Chen | 365/185.03 |
| 7,349,258 B2 * | 3/2008 | Fong et al. | 365/185.18 |
| 7,433,235 B2 * | 10/2008 | Chae et al. | 365/185.18 |
| 7,525,842 B2 | 4/2009 | Nguyen et al. | |

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

*Primary Examiner* — Viet Q Nguyen
(74) *Attorney, Agent, or Firm* — Davis Wright Tremaine LLP

(57) ABSTRACT

In a flash memory two or more pages in a plane are read in rapid succession by maintaining global word line voltages throughout multiple page reads, and by simultaneously transitioning the old selected word line from a discrimination voltage to a read voltage and transitioning the new selected word line from the read voltage to a discrimination voltage.

4 Claims, 11 Drawing Sheets

(56) References Cited

U.S. PATENT DOCUMENTS

| | | | |
|---|---|---|---|
| 7,583,540 B2 * | 9/2009 | Park et al. | 365/185.33 |
| 7,606,075 B2 * | 10/2009 | Aritome et al. | 365/185.18 |
| 7,839,696 B2 * | 11/2010 | Lue | 365/185.28 |
| 8,018,777 B2 * | 9/2011 | Kang | 365/185.23 |
| 8,120,959 B2 * | 2/2012 | Lee et al. | 365/185.13 |
| 8,134,853 B2 * | 3/2012 | Fastow et al. | 365/72 |
| 8,345,466 B2 * | 1/2013 | Maejima et al. | 365/148 |
| 8,767,468 B2 * | 7/2014 | Lee et al. | 365/185.18 |
| 2008/0094927 A1 | 4/2008 | Kim | |
| 2008/0310224 A1 | 12/2008 | Roohparvar et al. | |
| 2011/0157984 A1 | 6/2011 | Chung | |
| 2012/0044765 A1 | 2/2012 | Incarnati et al. | |
| 2012/0155166 A1 | 6/2012 | Li | |
| 2014/0108705 A1 * | 4/2014 | Gorobets | 711/103 |

\* cited by examiner

FAST-READING NAND FLASH MEMORY

BACKGROUND

This application relates to the operation of re-programmable non-volatile memory systems such as semiconductor flash memory, and more specifically, to systems and methods for rapidly reading data stored in such memory systems.

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile, and retains its stored data even after power is turned off. Also, unlike ROM (read only memory), flash memory is rewritable similar to a disk storage device. In spite of the higher cost, flash memory is increasingly being used in mass storage applications.

Flash EEPROM is similar to EEPROM (electrically erasable and programmable read-only memory) in that it is a non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions. Flash memory such as Flash EEPROM allows entire blocks of memory cells to be erased at the same time.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell.

Flash memory cells are generally read in parallel, in units of a page, which extends along a word line. A discrimination voltage is applied to the selected word line, while cells along all other word lines are turned on by applying a relatively high voltage. The cells are then read by sense amplifiers connected to bit lines. Reading may include reading from one word line after another. It is generally desirable to perform such multi-page reading rapidly.

SUMMARY OF THE INVENTION

In a flash memory, the time between page reads may be reduced in a fast-read mode by keeping unselected word lines and global word lines charged between page reads. Voltages that are the same for both page reads are maintained, while voltages that are to be changed are changed in parallel rather than in series. Word line discharge circuits may allow discharge of word lines of one block while simultaneously charging word lines of another block so that the delay between page reads in different blocks is reduced.

An example of a method of reading data from a NAND flash memory array includes applying a first voltage to a first word line of a plurality of word lines to read memory cells along the first word line; at the same time, applying a second voltage to other word lines of the plurality of word lines to turn on memory cells along the other word lines of the plurality of word lines, memory cells along the plurality of word lines connected in series along a bit line direction; and subsequently, transitioning the first word line to the second voltage and transitioning a second word line of the plurality of word lines from the second voltage to the first voltage in order to read the memory cells along the second word line, wherein word lines of the plurality of word lines other than the first and second word lines remain at the second voltage throughout the transitioning.

The time period for transitioning the first word line from the first voltage to the second voltage and transitioning the second word line from the second voltage to the first voltage may be less than 10% of the overall time for reading a word line. The first word line and the second word line may be in the same erase block, or in different erase blocks in the same plane.

An example of a method of reading data from a NAND string includes applying a discrimination voltage to a control gate of a first cell of the NAND string during a read of the first cell; applying a read voltage to control gates of other cells of the NAND string during the read of the first cell, the read voltage exceeding threshold voltages of cells of the NAND string; subsequently, in a transition period, ramping control gate voltage of the first cell to the read voltage, while ramping control gate voltage of a second cell of the NAND string from the read voltage to a discrimination voltage; and maintaining the read voltage on control gates of multiple other cells of the NAND string throughout the transition period.

Subsequent to the transition period, a read of the second cell may be performed while applying the discrimination voltage to the control gate of the second cell. The read voltage may be continuously applied to control gates of cells of the NAND string other than the first cell and the second cell from the start of the read of the first cell to the end of the read of the second cell.

An example of a method of reading data from a NAND flash memory array includes applying a plurality of word line voltages to word lines of a first block in order to read data along a word line of the first block; and subsequently discharging the word lines of the first block while simultaneously charging word lines of a second block, the first and second blocks connected by common bit lines.

The first block may be connected to a first plurality of word line decoder and driver circuits through a first plurality of global word lines and the second block may be connected to a second plurality of word line decoder and driver circuits through a second plurality of global word lines. The plurality of word line voltages may be applied to the word lines of the first block through a plurality of block select transistors that connect the word lines of the first block to a plurality of global word lines; and the word lines of the first block may discharge trough a set of discharge transistors that connect the word lines of the first block to a common discharge node. Word lines of the second block may be charged through the plurality of global word lines, individual global word lines remaining charged throughout the discharging of the word lines of the first block and the charging of the word lines of the second block. A voltage may be provided to global word lines by a charge pump, the charge pump remaining in operation throughout the reading of data along the word line of the first block, the subsequent discharging of word lines of the first block and simultaneous charging of word lines of the second block, and subsequent reading of data from the second block. Discharging the word lines of the first block while simultaneously charging word lines of the second block may be in response to a command to perform high speed reading.

An example of a NAND flash memory array having at least two read speeds includes a plurality of blocks of NAND flash memory, each block containing a plurality of word lines; global word lines that connect to word lines of individual blocks of the plurality of blocks through respective block select transistors; and word line driver circuits that supply word line voltages to word lines of the plurality of blocks, the word line driver circuits, in a conventional-read mode, ceasing to supply word line voltages during a period between individual page reads and, in a fast-read mode, continuing to supply word line voltages throughout the period between individual page reads.

A charge pump may be connected to the word line driver circuits, the charge pump ceasing to operate during the period between individual page reads in the conventional-read mode, the charge pump continuing to operate throughout the period between individual page reads in the fast-read mode. A word line discharge circuit may selectively connect a word line to a discharge node, the word line discharge circuit and the respective block select transistor of the word line being physically distinct and being separately controlled. The word line discharge circuit may be a transistor and the discharge node may be connected to ground. The period between individual page reads may be a period between reading a first page along a first word line in a block and reading a second page along a second word line in the block. The period between individual page reads may be a period between reading a first page along a first word line in a first block and reading a second page along a second word line in a second block.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION

Memory System

Figure 1:
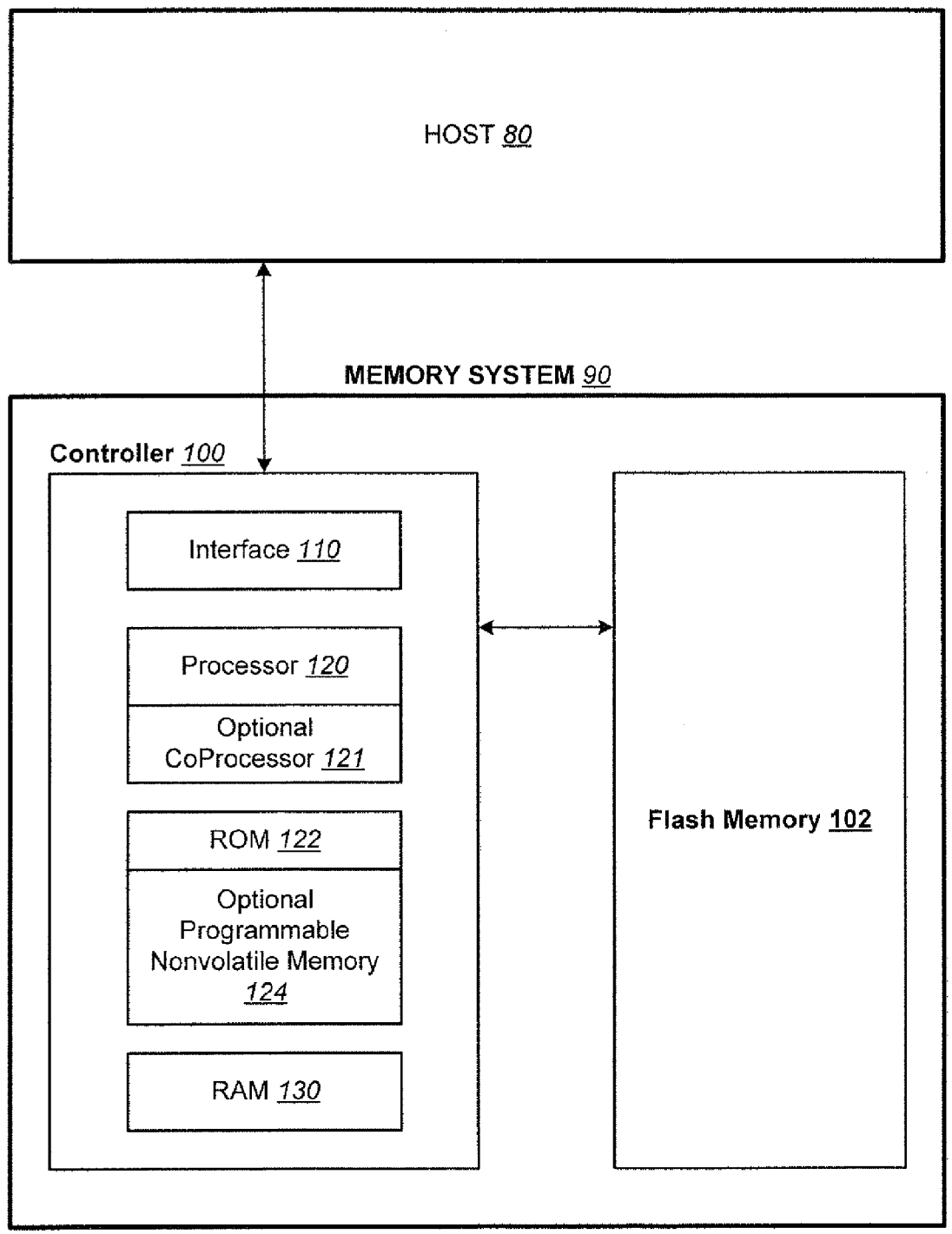
FIG. 1 illustrates schematically the main hardware components of a memory system suitable for implementing the present invention.

FIG. 1 illustrates schematically the main hardware components of a memory system suitable for implementing the present invention. The memory system 90 typically operates with a host 80 through a host interface. The memory system is typically in the form of a memory card or an embedded memory system. The memory system 90 includes a flash memory 102 whose operations are controlled by a controller 100. The memory 102 comprises one or more array of non-volatile memory cells distributed over one or more integrated circuit chip. The controller 100 includes an interface 110, a processor 120, an optional coprocessor 121, ROM 122 (read-only-memory), RAM 130 (random access memory) and optionally programmable nonvolatile memory 124. The interface 110 has one component interfacing the controller to a host and another component interfacing to the memory 102. Firmware stored in nonvolatile ROM 122 and/or the optional nonvolatile memory 124 provides codes for the processor 120 to implement the functions of the controller 100. Error correction codes may be processed by the processor 120 or the optional coprocessor 121. In an alternative embodiment, the controller 100 is implemented by a state machine (not shown). In yet another embodiment, the controller 100 is implemented within the host.

Physical Memory Structure

Figure 2:
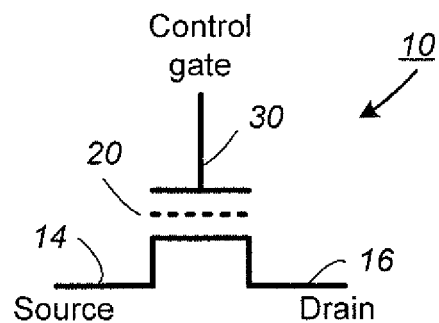
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage elements have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

Figure 3:
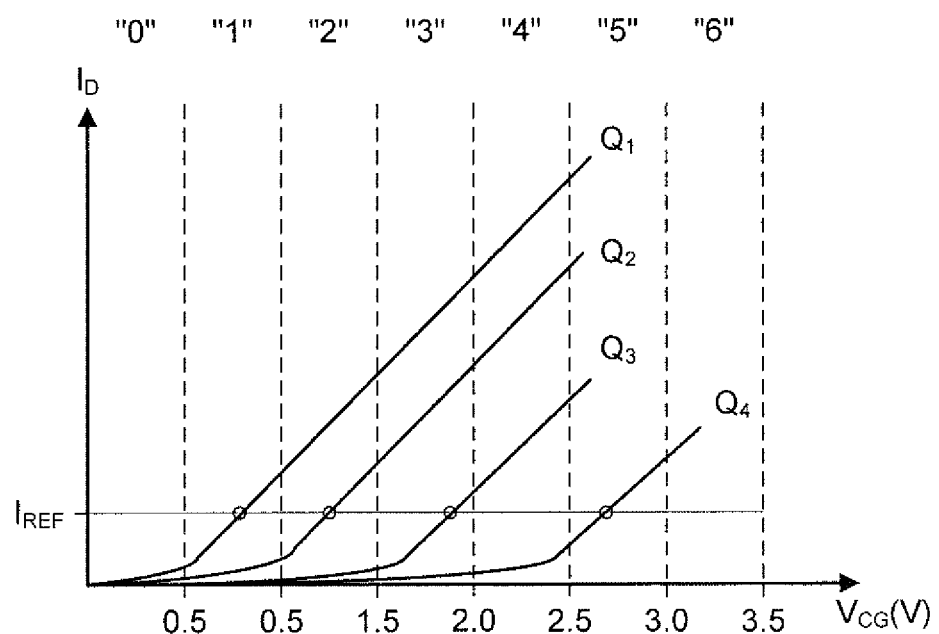
FIG. 3 illustrates the relation between the source-drain current $I_D$ and the control gate voltage $V_{CG}$ for four different charges Q1-Q4 that the floating gate may be selectively storing at any one time at fixed drain voltage.

FIG. 3 illustrates the relation between the source-drain current $I_D$ and the control gate voltage $V_{CG}$ for four different charges Q1-Q4 that the floating gate may be selectively storing at any one time (just four charges are shown for illustration while other charges may be similarly stored). With fixed drain voltage bias, the four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven programmed memory states "0", "1", "2", "3", "4", "5", "6", and the erased state (VCG<0, not shown in FIG. 3) may be demarcated by partitioning the threshold window into eight regions in intervals of 0.5V each. For example, if a reference current, IREF of 2 μA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5". Other charges that are not shown in FIG. 3 may correspond to other memory states (e.g. "0", "4", "6" states).

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

Figure 4A:
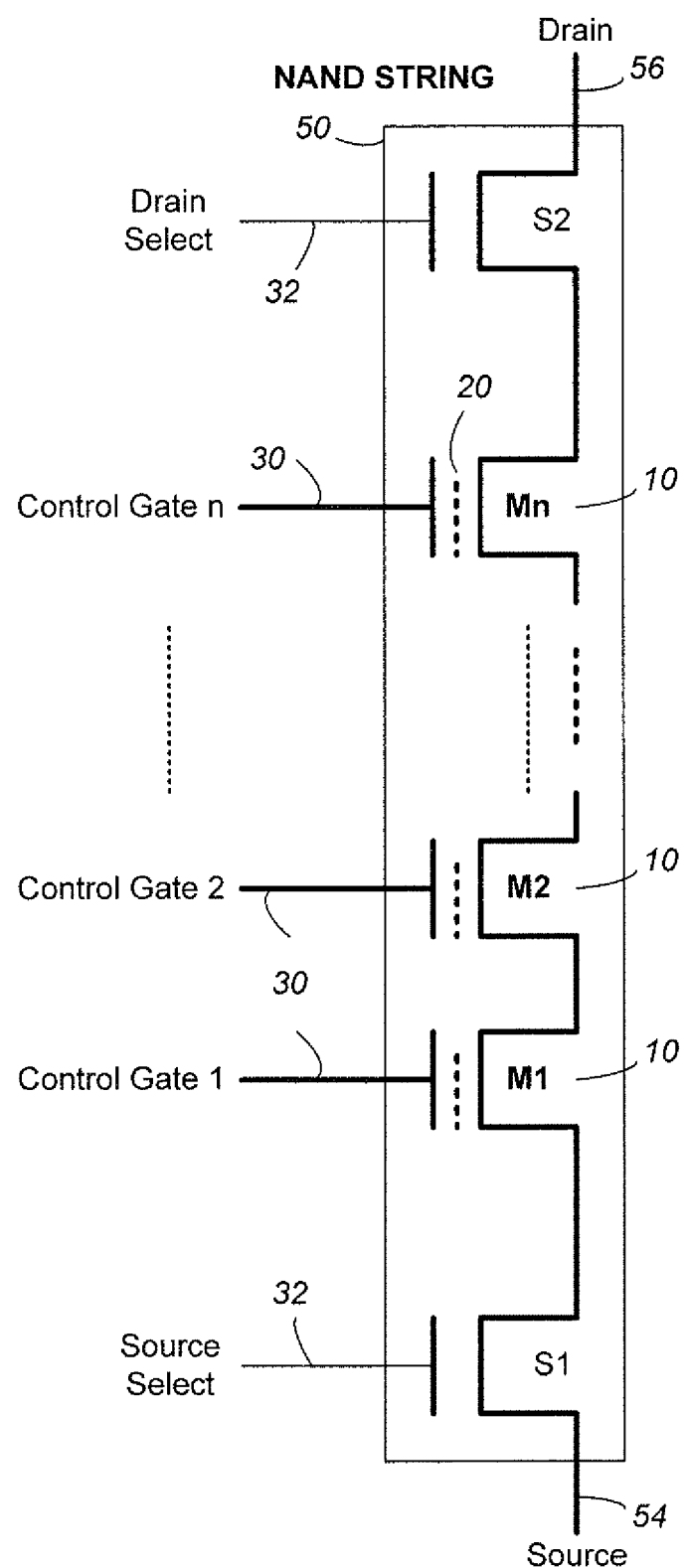
FIG. 4A illustrates schematically a string of memory cells organized into a NAND string.

FIG. 4A illustrates schematically a string of memory cells organized into a NAND string. A NAND string 50 comprises of a series of memory transistors M1, M2, . . . Mn (e.g., n=4, 8, 16 or higher) daisy-chained by their sources and drains. A pair of select transistors S1, S2 controls the memory transistor chain's connection to the external world via the NAND string's source terminal 54 and drain terminal 56 respectively. In a memory array, when the source select transistor S1 is turned on, the source terminal is coupled to a source line (see FIG. 4B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 4B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

Figure 4B:
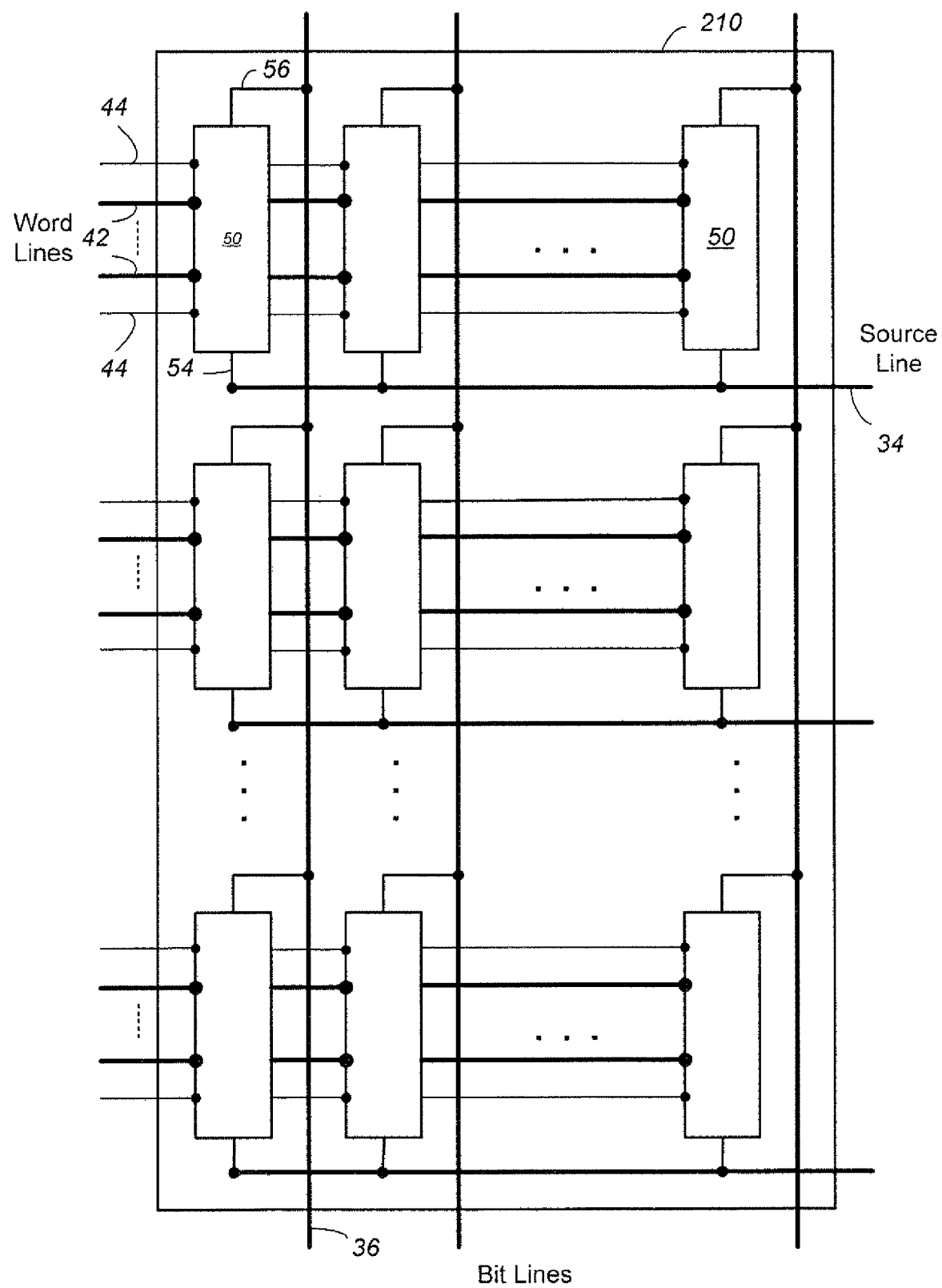
FIG. 4B illustrates an example of a NAND array 210 of memory cells, constituted from NAND strings 50 such as that shown in FIG. 4A.

FIG. 4B illustrates an example of a NAND array 210 of memory cells, constituted from NAND strings 50 such as that shown in FIG. 4A. A bit line such as bit line 36 is coupled to the drain terminal 56 of NAND strings thus connecting NAND strings along the bit line direction. Along each bank of NAND strings, a source line such as source line 34 is coupled to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings.

Figure 5:
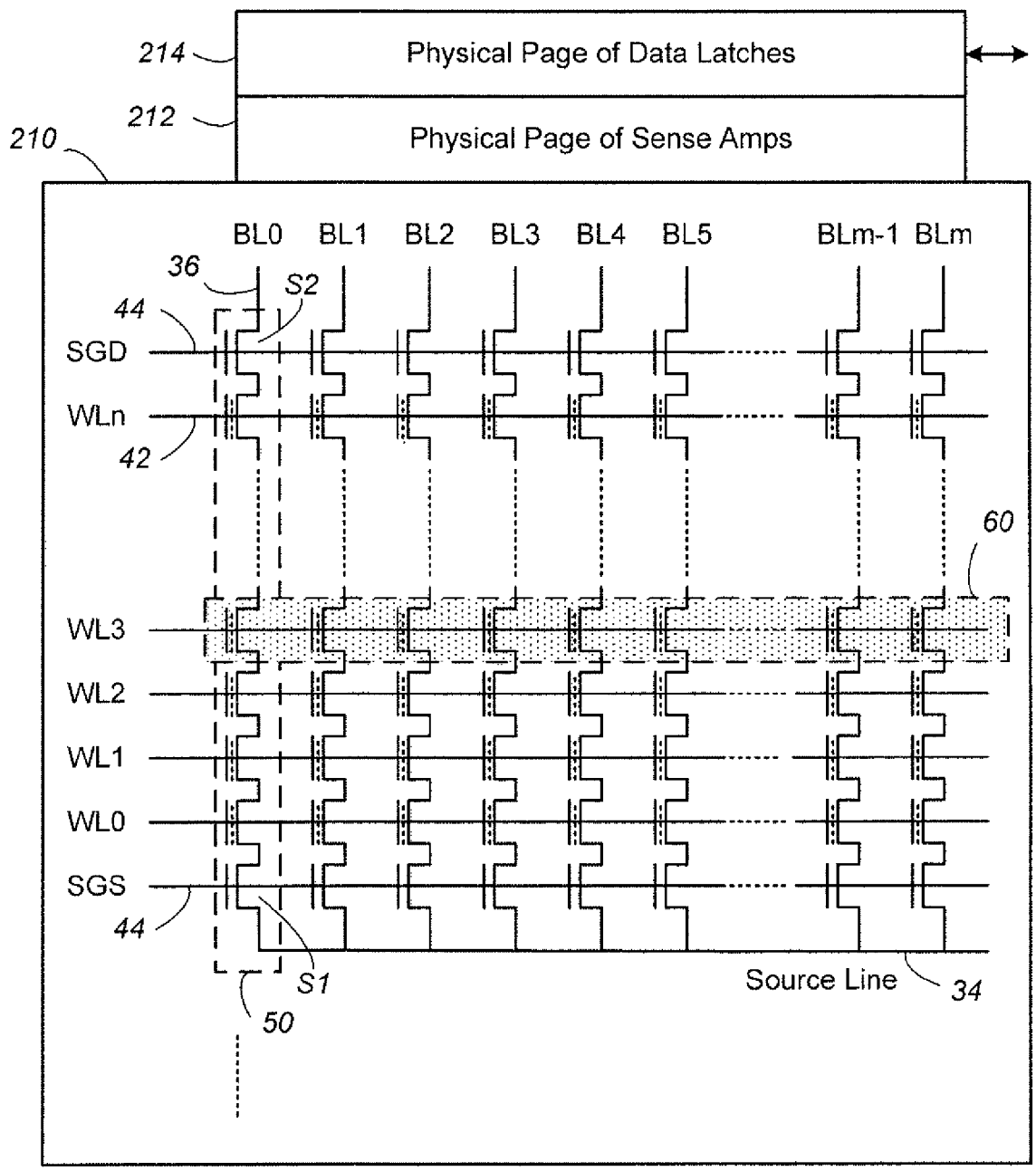
FIG. 5 illustrates a page of memory cells, organized in the NAND configuration, being sensed or programmed in parallel.

FIG. 5 illustrates a page of memory cells, organized in the NAND configuration, being sensed or programmed in parallel. FIG. 5 essentially shows a bank of NAND strings 50 in the memory array 210 of FIG. 4B, where the detail of each NAND string is shown explicitly as in FIG. 4A. A physical page, such as the page 60, is a group of memory cells enabled to be sensed or programmed in parallel. This is accomplished by a corresponding page of sense amplifiers 212. The sensed results are latched in a corresponding set of latches 214. Each sense amplifier can be coupled to a NAND string via a bit line. The page is enabled by the control gates of the cells of the page connected in common to a word line 42 and each cell accessible by a sense amplifier accessible via a bit line 36.

Reading a page of memory cells such as page 60 generally includes applying a discrimination voltage (or series of discrimination voltages) to the selected word line (e.g. WL3 for page 60) while all other word lines (e.g. WL0-WL2 and WL4-WLn in FIG. 5) receive a sufficient voltage to turn on their cells. This voltage may be referred to as a read-pass voltage, or simply "read voltage" and may be denoted "Vread." In order to provide these voltages to the word lines, a set of row decoder circuits is generally provided. In some examples, word line driver circuits are shared between multiple blocks using global word lines that are selectively connected to word lines of a given block.

Figure 6A:
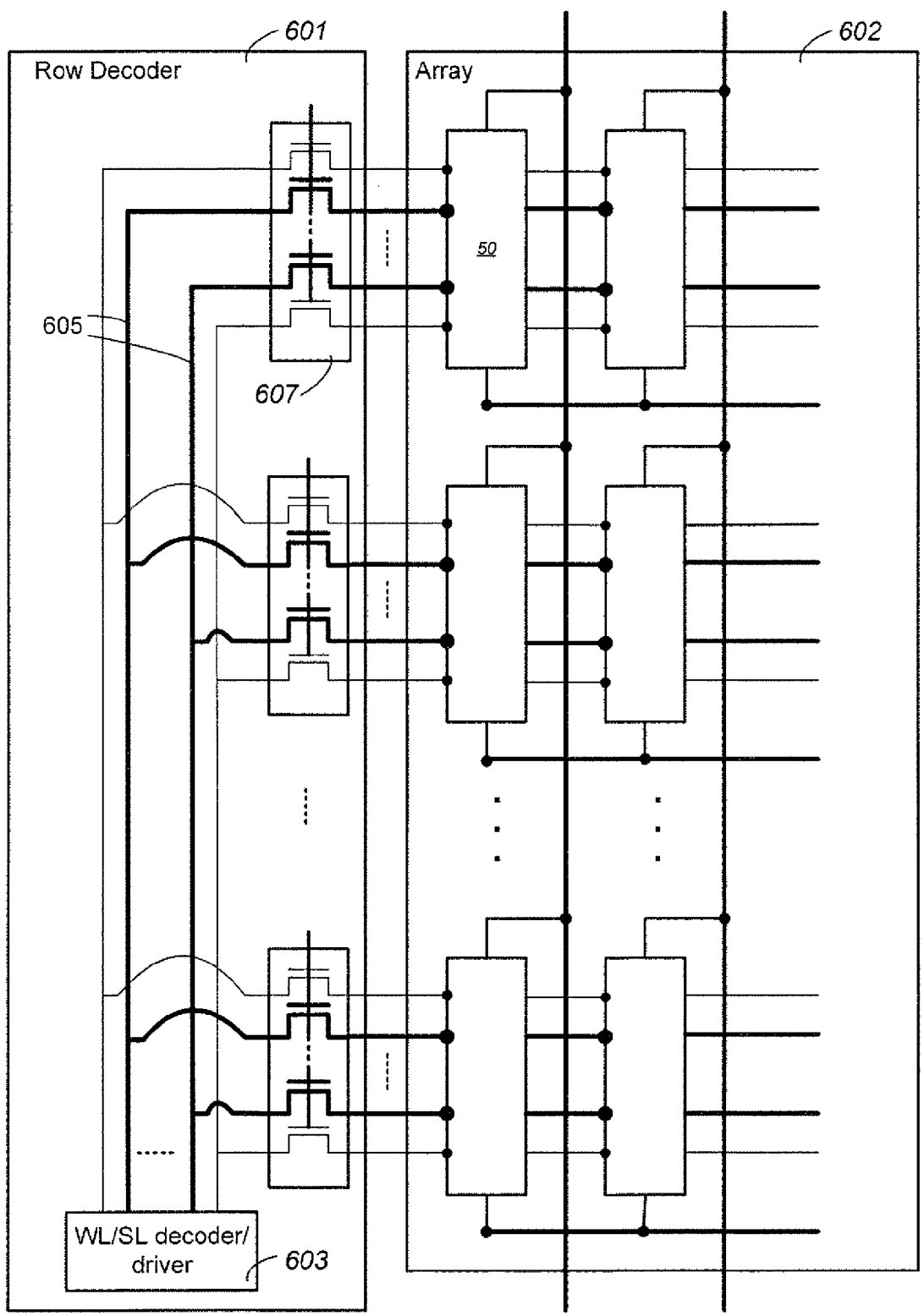
FIG. 6A illustrates an example of row decoder circuits for a NAND flash memory.

FIG. 6A shows an example of row decoder circuits 601 that provide word line voltages to word lines of multiple blocks of memory array 602. Row decoder circuits 601 include word line and select line decoder/driver circuits 603 that generate appropriate voltages for accessing a particular word line. These voltages are applied to global word lines 605. Global word lines 605 are connected to word lines of each block through block select transistors. Thus, when row decoder circuits 601 receive a read command and an address for a particular word line to be read, the decoder/driver circuits 603 provide an appropriate set of voltages to the global word lines 605 for reading the word line indicated by the address. For example, if the address specified WL5, then the decoder/driver circuits would provide a discrimination voltage to the global word line connected to WL5 and provide a read voltage to all other global word lines. Appropriate voltages would also be provided to turn on select gates. This set of voltages would be applied to word lines of the selected block by turning on the block select transistors of the selected block. Word lines of all other blocks would be isolated from the global word lines by keeping their block select transistors turned off.

In some cases, decoder/driver circuits may be shared between a large number of blocks. This generally requires long global word lines with correspondingly high capacitance. Such long word lines may take a relatively long time to charge up to a target voltage. Applying a set of voltages to a selected block may require some time to charge up global word lines, followed by some time to charge up the word lines of the block and allow the voltages to stabilize before reading. Then, after reading, global word lines and word lines of the block are discharged prior to executing a subsequent command.

Figure 6B:
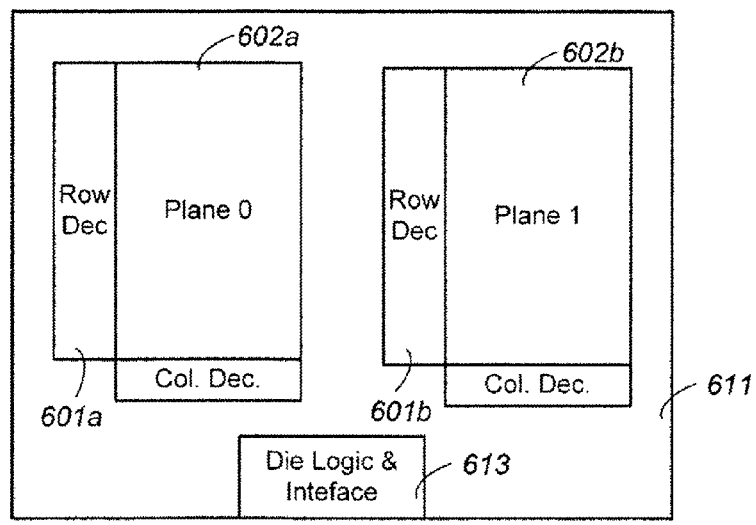
FIG. 6B illustrates an example of two planes with separate row decoder circuits.

FIG. 6B shows an example of a multi-plane memory die 611 in which each plane has one set of row decoder circuits that serve all blocks of the plane (i.e. all blocks of the plane are served by the same decoder/driver circuits and the same set of global word lines). Plane 0 includes an array of memory cells 602a that is accessed by row decoder circuits 601a. Plane 1 includes an array of memory cells 602b that is accessed by row decoder circuits 601b. Die logic and interface circuits 613 link planes 0 and 1 to a memory controller. In general, planes in a die may be accessed in parallel so that a page read may be performed in plane 0 while another plane read is performed in plane 1. Thus, where two page reads are to be performed in the two planes these can be done in rapid succession because each plane operates substantially independently. Performing page reads in rapid succession is more difficult where both pages are located in the same plane, for example, where both page reads are in plane 0.

Figure 7A:
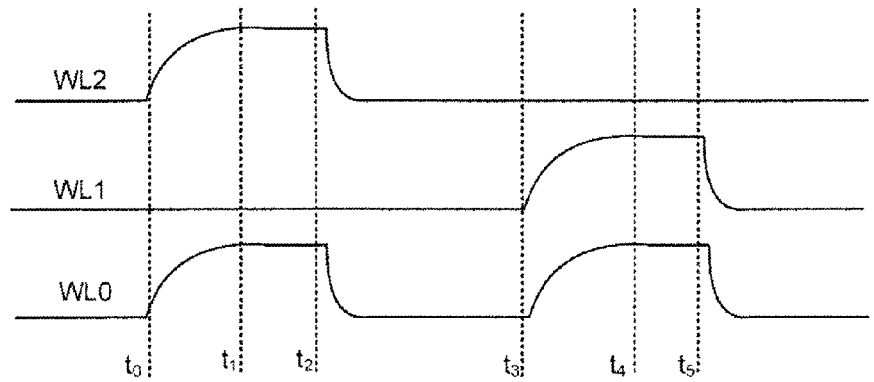
FIG. 7A is a timing diagram of two page reads performed in a conventional-read mode.

FIG. 7A shows an example of voltages applied to three word lines (WL0, WL1, WL2) in a block during sequential reading of WL1 and WL2. In the first page read, WL1 is selected. At time $t_0$, the voltage to all other word lines in the block begin to be ramped to a read voltage that is sufficient to turn on all memory cells. Only voltages for WL0 and WL2 are shown but it will be understood that the voltage is similarly ramped to all other unselected word lines of the block. In some cases, global word lines may be precharged before time t0 so that t0 represents the time when the block select transistors are turned on. In other cases, global word lines and word lines of the selected block are ramped together. At time $t_1$, reading of WL1 begins. Reading of WL1 continues until time $t_2$. The voltage applied to WL1 for this read is 0 volts. It will be understood that other discrimination voltages may be used and that a series of discrimination voltages may be used, for example to read a word line in an MLC memory array.

After the page read of WL1 is finished at time t2, the voltage on the unselected word lines is discharged. The word lines may be discharged through the block select transistors and global word lines. Such discharging may take significant time. Subsequently, a similar sequence to that described above is repeated to read WL2. Unselected word lines (including WL1) are ramped to read voltage beginning at time $t_3$. Then reading of WL2 begins at time $t_4$ and ends at time $t_5$.

The reading operation of FIG. 7A may be considered a conventional-read operation in which page reads are sequentially performed, and in which voltages on unselected word lines and global word lines are ramped up prior to reading the page and are discharged after the page is read. Such a conventional-read treats each page read in isolation and may be suitable for cases where an isolated page read is performed. However, where multiple page reads are to be performed such conventional-read operations may take more time than necessary.

In some cases, sequential page reads are performed as part of a read operation, for example, in response to a host read command that specifies a portion of data that extends over more than one page. In this case, the memory system may perform the page reads in an efficient manner that takes advantage of knowledge regarding multiple page reads.

According to an aspect of the present invention, knowledge regarding multiple page reads is used to perform the page reads in quick succession, without the long charging and discharging times that may occur in a conventional-read, and with some overlap between page read operations of different word lines. For example, where a memory system knows that a page read of memory cells of a particular word line will be followed by a page read of another word line in the same plane, certain voltages that are required for both page reads may be maintained (rather than discharging and subsequently charging up again), and ramping voltages of selected word lines may be done in parallel (old selected word line may be ramped up to read voltage while new selected word line is ramped down from the read voltage to a discrimination voltage).

Figure 7B:
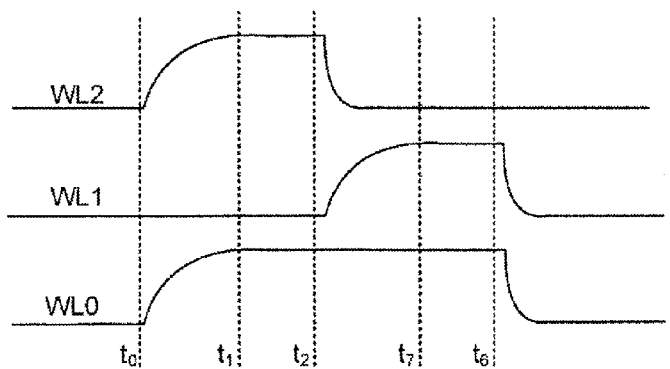
FIG. 7B is a timing diagram of two page reads performed in a fast-read mode.

FIG. 7B shows an example of voltages applied to three word lines (WL0, WL1, WL2) in a block during sequential reading of WL1 and WL2 in a fast-read mode that is different from the conventional-read described with respect to FIG. 7A. In the first page read, WL1 is selected as before and, at time $t_0$, the voltage to all other word lines in the block start being ramped to a read voltage that is sufficient to turn on all memory cells. At time $t_1$, reading of WL1 begins. Reading of WL1 continues until time $t_2$. The voltage applied to WL1 for this read is 0 volts as before.

In contrast to the example of FIG. 7A, in which all unselected word lines and global word lines were discharged after time $t_2$, here unselected word lines (e.g. representative word line WL0) are maintained at the read voltage after time $t_2$. Thus, word lines that are not subject to either page reads are kept at the read voltage between page reads and are not discharged between page reads. Maintaining such voltages may mean continuing to operate a charge pump throughout this period and keeping the unselected word lines connected, through block select transistors and global word lines, to the charge pump (or other voltage supply). Other voltages may also be maintained during the period between page reads (for example a voltage supplied to a common source line, voltages supplied to bit lines, etc.).

FIG. 7B also shows that the old selected word line WL1 is ramped up to the read voltage in parallel with ramping down the new selected word line WL2 from the read voltage to the discrimination voltage. Thus, these two word lines are transitioned simultaneously rather than sequentially in this example. The page read of cells of WL2 begins at time $t_7$ which represents a shorter delay than in the example of FIG. 7A (i.e. time period from $t_2$ to $t_3$ in FIG. 7A is longer than time from $t_2$ to $t_7$ in FIG. 7B). The examples of FIGS. 7A and 7B are for illustration only and are not drawn to scale. In particular, the time taken for transitioning word lines may be much shorter than the overall time for reading a word line. For example the time for transitioning (time t2 to t7 in FIG. 7B) may be less than one tenth (less than 10%) of the overall time for a word line read operation (time t0 to t2 in FIG. 7B).

Figure 8A:
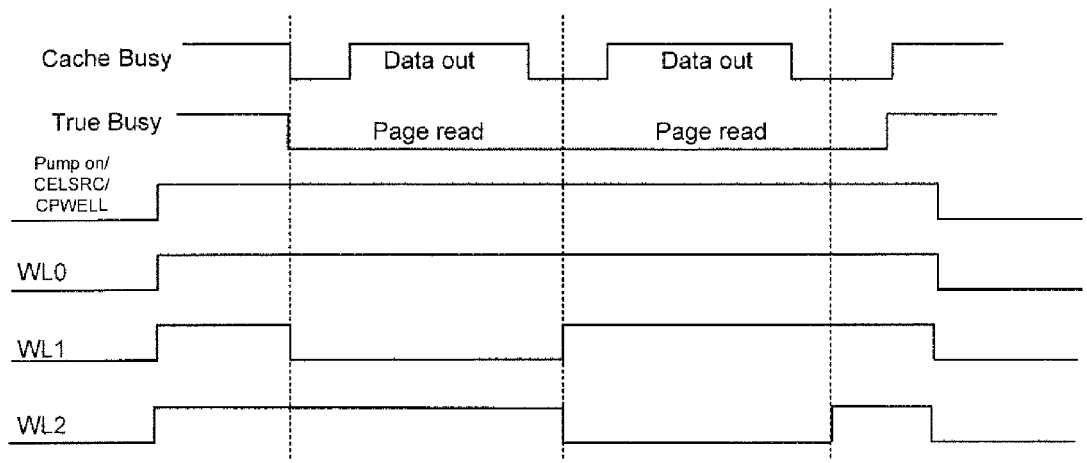
FIG. 8A is a timing diagram including data transfer operations.

FIG. 8A is a timing diagram showing data being read out from word lines WL1 and WL2 during a fast-read (this is a simplified timing diagram that does not show ramping or stabilizing). True busy remains asserted continuously throughout the time taken for both page reads. Because unselected word lines are maintained at a pass voltage throughout a series of word line reads in fast-read mode the memory generally requires a command to exit fast-read mode in order to discharge unselected word lines and return to a true ready state. Such a command may be issued by a host or memory controller. A single signal is shown representing "pump on" (i.e. signal to operate one or more charge pumps used to charge up the word lines), "CELSRC" (common source line), and CF WELL (common P-well bias). These signals are all maintained throughout the time taken for both page reads. The word line voltages are similar to those of FIG. 7B with WL0, representing unselected word lines, remaining at a read voltage throughout the two page reads. It will be understood that other unselected word lines (i.e. WL3-WLn, where the block contains n word lines) are biased similarly to WL0.

Figure 8B:
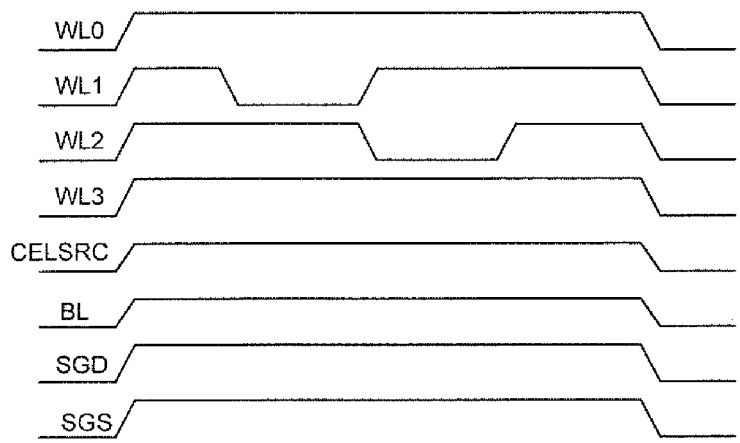
FIG. 8B is a timing diagram including additional signals.

FIG. 8B is a timing diagram that also shows the two page reads of WL1 and WL2. Word line voltages on word lines WL0-WL3 and CELSRC are as previously described. Bit line voltages, select gate voltages to drain side select gates (SGD) and source side select gates (SGS) are maintained at their target levels throughout the two read steps without discharging in between. This is in contrast to certain prior art memory systems in which of one or more of these lines are discharged between individual word line read operations.

In many cases, data is written sequentially in a block. For example, a portion of data, such as a file, may be written starting at WL0, then WL1, then WL2, and so on. When a host requests the data, or file, the word lines are read in this sequence. Thus, the pattern described above, reading WL1, then WL2 of the same block may be quite common. In other cases, reading may skip one or more word lines in the same block (e.g. read WL1 then WL5, without reading WL2, WL3, and WL4). Such reading can be performed using the same techniques described above as long as the two word lines are within the same block. However, when a page read of a word line in one block is followed by a page read of a word line in another block (a "random read"), a fast-read operation may not be as straightforward.

In many memory systems, word lines are discharged through global word lines. Thus, for example, decoder/driver circuits in the above example discharge WL1 and concurrently charge WL2 through their respective global word lines (which are connected through the block select transistors). However, where two successive page reads are in two different blocks, the global word lines are generally busy discharging the word lines of the first block, and thus unavailable for charging up word lines of the second block, for some period of time between page reads. This makes fast-read more challenging when a random read occurs. Some hardware features may be used to facilitate fast-reading when successive page reads are in different blocks.

Figure 9:
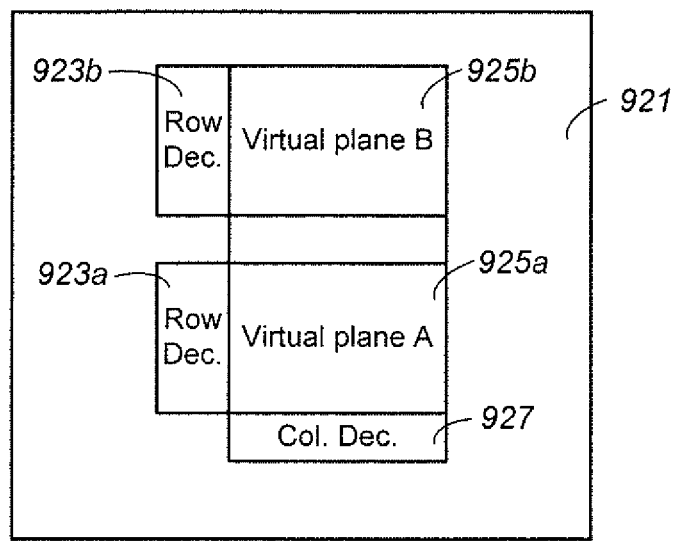
FIG. 9 shows a memory die in which each plane has two row decoders.

FIG. 9 shows an example of a plane 921 that has two sets of row decoder circuits 923a, 923b serving virtual planes 925a, 925b respectively. In other examples, more than two virtual planes may be formed in this way. While all blocks in such a plane share the same bit lines, and share column decoder circuits 927, half of the blocks (those in virtual plane A) share one set of row decoder circuits 923a while the other half of the blocks (those in virtual plane B) share a different set of row decoder circuits 923b. In an arrangement with such separate row decoders for different blocks within the same plane, a situation may arise where a first page read is in virtual plane A and a subsequent page read is in virtual plane B. Because each virtual plane has separate row decoder circuits, it is possible to discharge word lines of the old selected block in virtual plane A using global word lines of corresponding row decoder circuits 923a, while simultaneously charging up word lines of the new selected block in virtual plane B using global word lines of corresponding row decoder circuits 923b.

Figure 10:
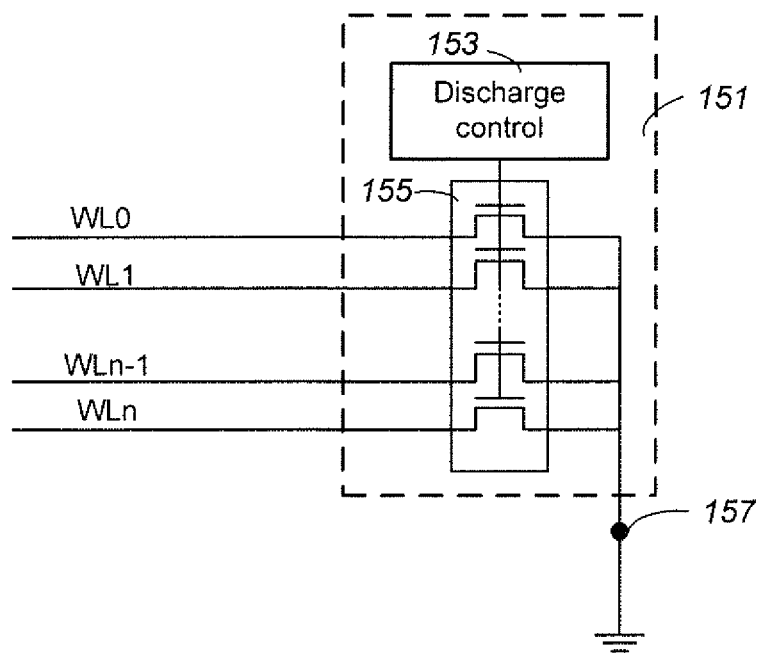
FIG. 10 shows an example of word line discharge circuits.

FIG. 10 shows an example of a word line discharge circuit 151 that is connected to the word lines of a block. All word lines of the block (WL0-WLn in this example) may be connected to a common word line discharge circuit 151 which includes a word line discharge transistor connected to each word line. While not shown in FIG. 10, select lines on both source and drain sides may be similarly connected so that they can be similarly discharged. Alternatively, select lines may be separately managed. All of the word line discharge transistors of a block have gates driven by a common discharge control circuit 153 so that all word lines of the block can be discharged together. The word line discharge transistors may be similar to block select transistors and provide similar selective connection to the word lines of the block. However, unlike the block select transistors, all of the word line discharge transistors connect to a common discharge node 157. Thus, when the word line discharge transistors 155 turn on, all of the word lines of the block are connected to common discharge node 157. In FIG. 10, the common discharge node 157 is shown as connected to ground, although in other examples a different discharge node may be used with some bias applied.

By using a word line discharge circuit, the word lines of a block that includes the word line that was the target of the last page read may be discharged at the same time that global word lines are used to charge up bit lines of a block that includes the word line that is the target of the next page read. This may be achieved without discharging the global bit lines or turning off any charge pump or other voltage supply.

Figure 11:
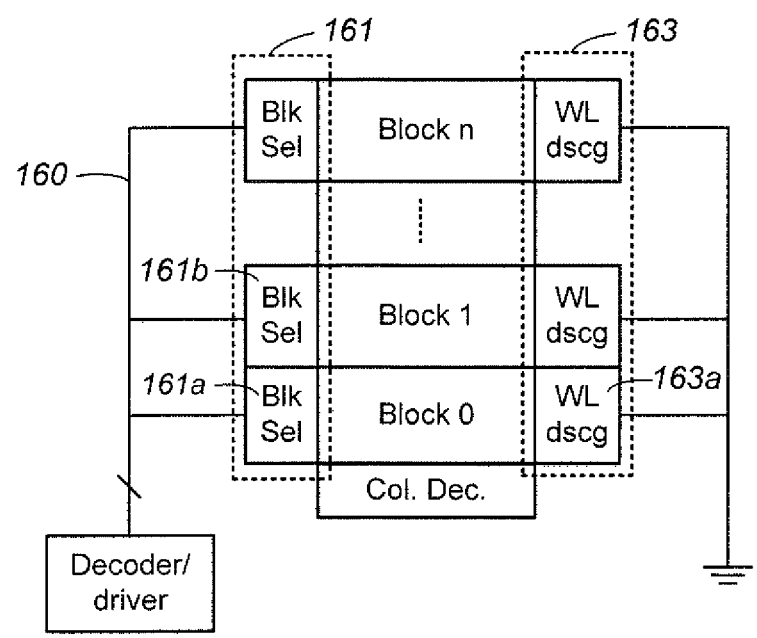
FIG. 11 shows a plane in which each block has separate block select circuits and word line discharge circuits.

FIG. 11 shows an example of blocks of a plane (block 0-block n). The word lines of each block are selectively connectable to global word lines 160 through sets of block select transistors 161, and are selectively connectable to a discharge node (ground) through sets of word line discharge circuits 163. Thus, where a page read of a word line of block 0 is followed by a page read of a word line of block 1, the word line discharge circuits of block 0 163a may discharge the word lines of block 0 with block select transistors of block 0 161a turned off (isolating block 0 from global word lines 160). Simultaneously, the word lines of block 1 are charged up to their target voltages through block select transistors of block 1 161b. The addition of word line discharge circuits 163 increases the size of the memory array as compared with a memory array that does not have such discharge circuits. Not only is there some area occupied by the discharge circuit itself, the pitch of the memory array (i.e. word line to word line spacing) may need to be increased in some cases to accommodate connection of discharge circuits.

Figure 12A:
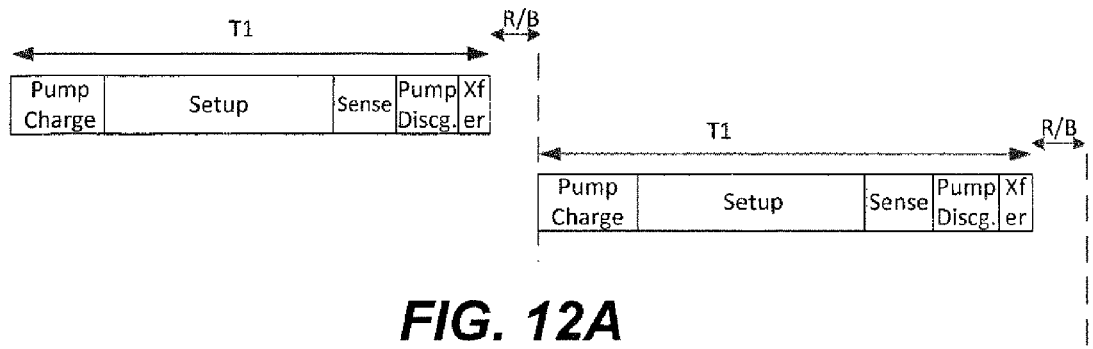
FIGS. 12A-12C are timing diagrams illustrating time savings in fast-read mode.
Figure 12B:
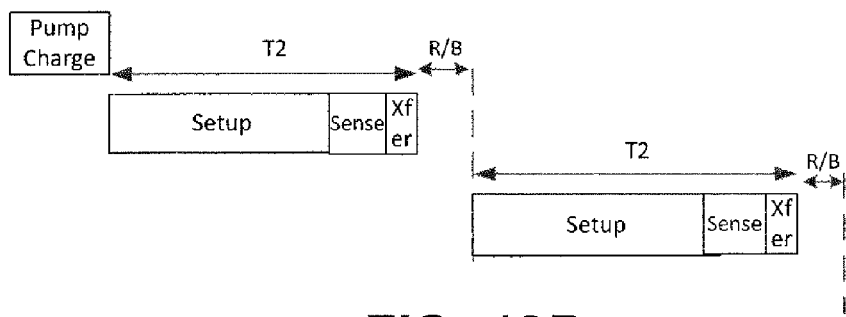
Figure 12C:
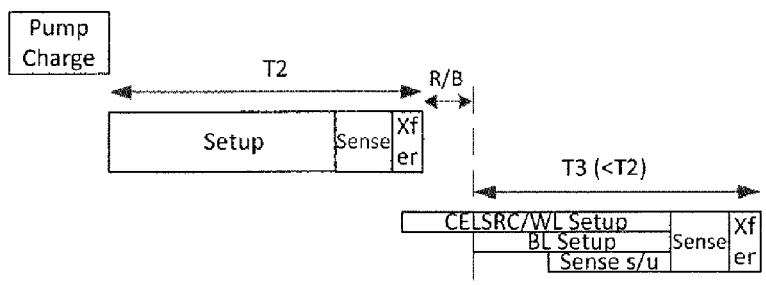

Time savings that may be achieved using certain embodiments of the present invention are illustrated in FIGS. 12A-12C, which each show two successive page reads. FIG. 12A shows a conventional read operation (i.e. not in fast-read mode). FIG. 12 shows a first page read taking a time T1, which includes time to charge up a charge pump ("Pump Charge"), perform setup of various components, e.g. common source, word lines, bit lines, and sense amplifiers ("Setup"), perform sensing of data ("Sense"), discharge the charge pump ("Pump Discg.") and transfer data ("Xfer"). Following time T1 a short period is needed to toggle the Ready/Busy signal ("RIB") to ready. Then, reading of the next word line commences and similarly takes a time T1.

FIG. 12B is a timing diagram for two word line read operations performed in fast-read mode. Initially, a charge pump must be charged as before ("Pump charge"). However, the pump is not discharged after sensing so that the overall time for the read is reduced (i.e. time for pump charging plus T2 is less than T1). Subsequently, in the second word line read, the charge pump does not need to be charged up again so that the entire word line read operation takes time T2 (equal to T1 minus both charging and discharging times for the charge pump). Any subsequent word line read operations performed in the fast-read mode similarly take time T2 thus saving charging and discharging times for each word line that is read.

FIG. 12C is a timing diagram that shows additional time savings that may be achieved in fast-mode where particular hardware is available. For example, where separate row decoder circuits form separate virtual planes, setup for reading a subsequent word line may begin while transferring data from a previous word line. The first word line read operation is performed as before (i.e. as in FIG. 12B). However, instead of waiting for the R/B signal to return to the ready state, some setup operations may begin while data from the first read operation is being transferred from the memory array. Because the two word lines in this example are controlled by different row decoder circuits, the row decoder circuits for the second word line read may commence setup while the row decoder circuits for the first word line read are still busy. FIG. 12C shows setup of common source and word lines ("CELSRC/WL Setup") beginning prior to completion of transfer of the data of the first word line read. Bit line and sense amplifier setup start only after a ready signal is sent. It will be understood that the specific setup steps that may be taken may depend on the hardware used and that FIG. 12C represents just one example. The time for the second word line read is reduced to T3, which is less than T2, because part of the setup time is hidden by being performed in parallel with the first word line read. Similarly, subsequent word line reads may be performed in time T3 where different row decoders are used (e.g. if reads alternate between virtual planes).

CONCLUSION

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

It is claimed:

1. A method of reading data from a NAND flash memory array comprising:
　applying a first voltage to a first word line of a plurality of word lines to read memory cells along the first word line;
　at the same time, applying a second voltage to other word lines of the plurality of word lines to turn on memory cells along the other word lines of the plurality of word lines, memory cells along the plurality of word lines connected in series along a bit line direction; and
　subsequently, transitioning the first word line to the second voltage and transitioning a second word line of the plurality of word lines from the second voltage to the first voltage in order to read the memory cells along the second word line, wherein word lines of the plurality of word lines other than the first and second word lines remain at the second voltage throughout the transitioning.

2. The method of claim 1 wherein a time period for transitioning the first word line from the first voltage to the second voltage and transitioning the second word line from the second voltage to the first voltage is less than 10% of the overall time for reading a word line.

3. The method of claim 1 wherein the first word line and the second word line are in the same erase block.

4. The method of claim 1 wherein the first word line and the second word line are in different erase blocks in the same plane.

* * * * *